United States Patent
Sakai et al.

(10) Patent No.: US 6,459,048 B1
(45) Date of Patent: Oct. 1, 2002

(54) SURFACE-MOUNT ELECTRONIC COMPONENT

(75) Inventors: Kenichi Sakai, Toyama; Kenichi Kotani, Toyama-ken, both of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/598,692

(22) Filed: Jun. 21, 2000

(30) Foreign Application Priority Data

Jun. 25, 1999 (JP) ............................................. 11-180144
Jul. 22, 1999 (JP) ............................................. 11-208001

(51) Int. Cl.[7] ................................................. H01R 9/09
(52) U.S. Cl. ....................... 174/261; 174/260; 29/25.35; 361/772
(58) Field of Search .................. 174/260, 261, 174/262; 310/311, 340, 348; 257/779; 29/25.35; 361/760, 761, 772

(56) References Cited

U.S. PATENT DOCUMENTS

| | | | | |
|---|---|---|---|---|
| 5,357,662 A | * | 10/1994 | Takagi et al. | ............... 29/25.35 |
| 5,896,081 A | * | 4/1999 | Tzeng et al. | ............... 338/22 R |
| 5,952,898 A | * | 9/1999 | Nakata et al. | ............... 310/348 |
| 6,093,996 A | * | 7/2000 | Daidai et al. | ............... 310/348 |
| 6,133,637 A | * | 10/2000 | Hikita et al. | ................. 257/779 |

\* cited by examiner

*Primary Examiner*—Albert W. Paladini
(74) *Attorney, Agent, or Firm*—Keating & Bennett, LLP

(57) ABSTRACT

A surface-mount electronic component includes a terminal electrode film that is formed by various film-forming processes on the surface of a main unit of the surface-mount electronic component. A lead-in terminal extends from an internal electrode and is arranged in the surface-mount electronic component so as to extend up to the surface of the main unit for establishing electrical connection between the internal electrode and the terminal electrode film. In the surface-mount electronic component, the lead-in terminal of the internal electrode extends to at least one of the surfaces of the main unit, except a surface-mount surface of the main unit and the surface that is opposite to the surface-mount surface. An exposed portion of the lead-in terminal is coated by at least one of the terminal electrode film and a protective film.

14 Claims, 7 Drawing Sheets

SURFACE-MOUNT ELECTRONIC COMPONENT

BACKGROUND OF THE INVENTION

1. Field of the Invention

The present invention relates to surface-mount electronic components, and more particularly relates to a surface-mount electronic component having a terminal electrode film formed by a film-forming processing such as plating.

2. Description of the Related Art

FIG. 11 shows one example of a conventional surface-mount electronic component. A surface-mount electronic component 60 includes a rectangular main unit 11 having three terminal electrode films 12 to 14 provided on the surface thereof by electroless plating or electroplating. The terminal electrode films 12 and 14 are provided on the corresponding ends of the main unit 11 and function as an input terminal electrode film 12 is located between the terminal electrode films 12 and 14 and functions as a ground terminal.

The main unit 11 is formed by adhering a piezoelectric substrate 15, an overlaid ceramic cover member 16, and an underlaid ceramic cover member 17. The major surfaces of the piezoelectric substrate 15 facing each other have corresponding vibrating electrodes 21 and 22 provided thereon, as shown in FIG. 12. These vibrating electrodes 21 and 22 function as internal electrodes and constitute, along with the piezoelectric substrate 15, a piezoelectric resonator 230. As shown in FIG. 11, a lead-in terminal 21a of the vibrating electrode 21 extends to the right end portion of the piezoelectric substrate 15 and is exposed at the surface of the main unit 11, including a right end surface 11a. A lead-in terminal 22a of the vibrating electrode 22 extends to the left end portion of the piezoelectric substrate 15 and is exposed at the surface of the main unit 11, including a left end surface 11b.

The terminal electrode film 12 is electrically connected to the lead-in terminal 21a, and the terminal electrode film 14 is electrically connected to the lead-in terminal 22a.

Thus, the surface-mount electric component 60 is constructed as a three-terminal electronic component (an oscillator) having an equivalent circuit as shown in FIG. 13. That is, the piezoelectric resonator 230 is connected between the terminal electrode film 12 (the input terminal) and the terminal electrode film 14 (the output terminal) capacitor C1 is located between the terminal electrode films 12 and 13 (the ground terminal), and is coupled across the terminal electrode films 12 and 13. A capacitor C2 is located between the terminal electrode films 13 and 14, and is coupled across the terminal electrode films 13 and 14.

In the conventional surface-mount electronic component 60, as shown in FIGS. 11 and 12, the lead-in terminals 21a and 22a are exposed at the end surfaces 11a and 11b of the main unit 11, respectively. Accordingly, when the terminal electrodes 12 to 14 are formed by electroless plating or electroplating, a plated film 26 is formed on the surface of each of the exposed lead-in terminals 21a and 22a.

However, since each of the lead-in terminals 21a and 22a is thin, the area for adhesion between the plated film 26 and the lead-in terminals 21a or 22a is very small. Therefore, the adhesion therebetween is weak, which causes the plated film 26 to be easily separated from the lead-in terminal 21a or 22a. For example, when some force or impact is applied to the plated film 26 in the course of forming the terminal electrodes 12 to 14, or some tension is caused when molten solder is applied to the plated film 26 in the course of mounting of the printed substrate, the plated film 26 can easily separate from the plated film 26. At this time, when the separated plated film 26 comes into contact with, for example, the terminal electrode film 12 or 13, as shown in FIG. 11, short-circuiting occurs between the terminal electrode films 12 and 13.

SUMMARY OF THE INVENTION

In order to overcome the problems described above, preferred embodiments of the present invention provide a highly reliable surface-mount electronic component which is constructed so as to prevent short-circuiting between terminal electrode films using films formed by various film-forming processes such as plating.

According to one preferred embodiment of the present invention, a surface-mount electronic component includes a terminal electrode film that is formed by film-forming processing on the surface of a main unit of the surface-mount electronic component, and a lead-in terminal conducted from an internal electrode disposed in the surface-mount electronic component and extending up to the surface of the main unit for establishing electrical connection between the internal electrode and the terminal electrode film. In the surface-mount electronic component, the lead-in terminal of the internal electrode is conducted up to at least one of the surfaces of the main unit, except a surface-mount surface of the main unit and the surface opposite to the surface-mount surface, and an exposed portion of the lead-in terminal is coated by at least one of the terminal electrode film and a protective film. In this context, the meaning of "coated" includes a case in which only a portion of an exposed part is coated.

A portion of the lead-in terminal exposed at the surface of the main unit is coated by the terminal electrode film and the protective film. When the terminal electrode film is formed by plating, the coating of the terminal electrode film or the protective film does not allow the plating to form on the exposed part of the lead-in terminal. Accordingly, easily separable and useless plated film is not formed.

In the surface-mount electronic component, alternatively, the surface-mount electronic component has at least two terminal electrode films, and the length of the exposed portion of each of the at least two terminal electrode films which is coated by none of the at least two terminal electrode films and the protective film, is shorter than the distance between the at least two terminal electrode films.

With the above-described setting, the length of the useless plated film, which is formed on each of the exposed parts of the lead-in terminals, and which is coated by none of the terminal electrode films and the protective film, is shorter than the distance between two adjacent terminal electrode films. Accordingly, even though the useless plated film is separated from the exposed part of the lead-in terminal, this separated plated film cannot cause short-circuiting to occur between the two adjacent terminal electrode films.

Other features, characteristics, elements and advantages of preferred embodiments of the present invention will be apparent from the detailed description of preferred embodiments of the present invention with reference to the attached drawings.

DETAILED DESCRIPTION OF PREFERRED EMBODIMENTS

Figure 1:
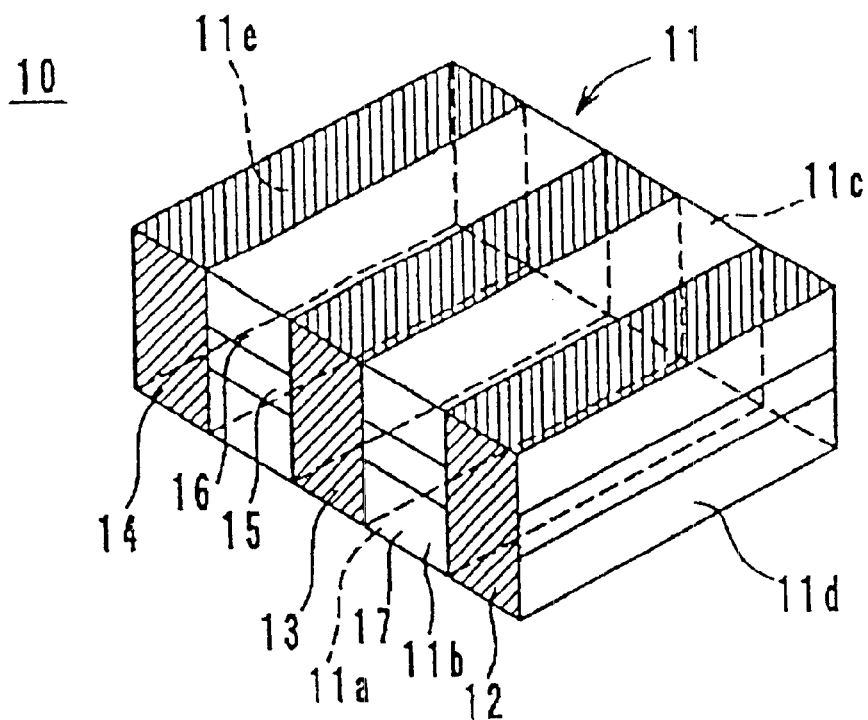
FIG. 1 is a perspective view of a surface-mount electronic component according to a first preferred embodiment of the present invention.

Preferred embodiments of the present invention are described with reference to the attached drawings. Identical elements included in the various preferred embodiments have corresponding reference numerals and repetitious description has been avoided.

Figure 11:
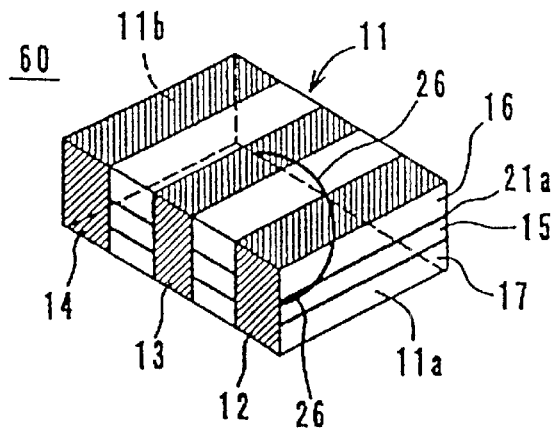
FIG. 11 is a perspective view of a conventional surface-mount electronic component.
Figure 12:
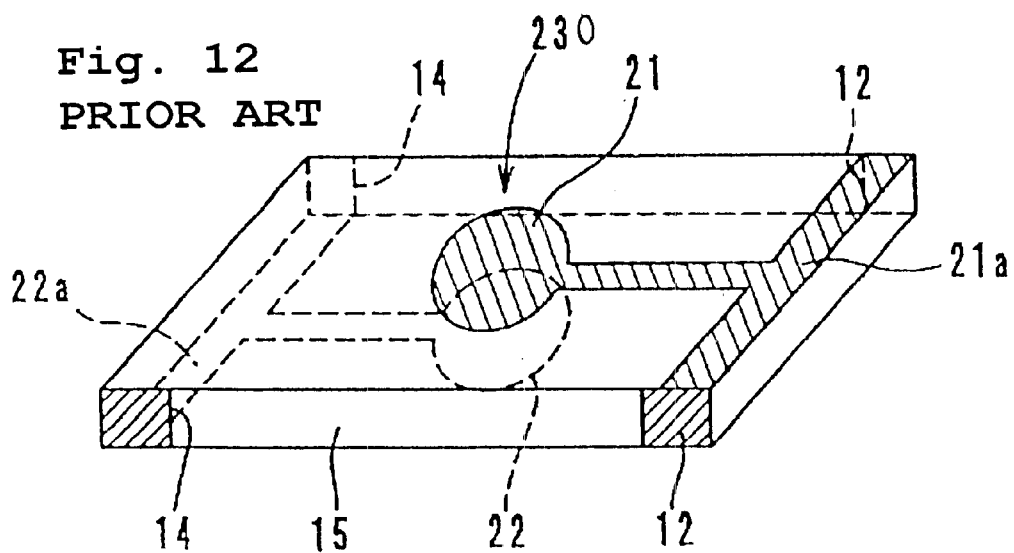
FIG. 12 is a perspective view showing the construction of electrodes of a piezoelectric substrate included in the surface-mount electronic component shown in FIG. 11.
Figure 13:
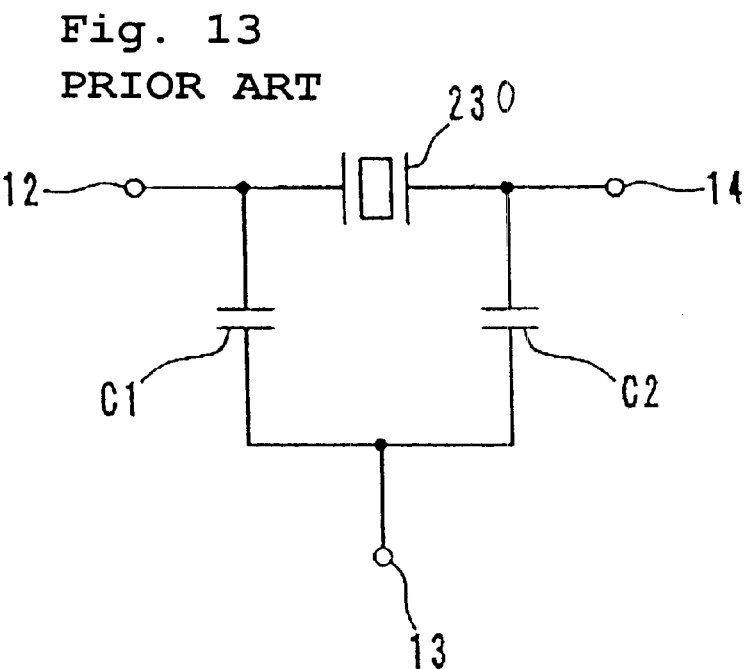
FIG. 13 is an equivalent circuit diagram of the surface-mount electronic component shown in FIG. 1.

FIG. 1 shows a surface-mount electronic component 10 according to the first preferred embodiment of the present invention. The surface-mount electronic component 10 is obtained by applying the present invention to the surface-mount electronic component 60 described in FIG. 11. Three terminal electrode films 12 to 14 are preferably provided on the surface of the main unit 11 via electroless plating, electroplating, or other suitable electrode formation processes.

The terminal electrode films 12 and 14 are formed so as to extend around the corresponding end portions of the main unit 11, and function as the input terminal and the output terminal, respectively. The terminal electrode film 13 is arranged between the terminal electrodes 12 and 14 so as to extend around the approximate central part of the main unit 11, and functions as the ground terminal. In FIG. 1, the bottom surface 11a of the main unit 11 defines a surface-mount surface for this electronic component 10.

Figure 2:
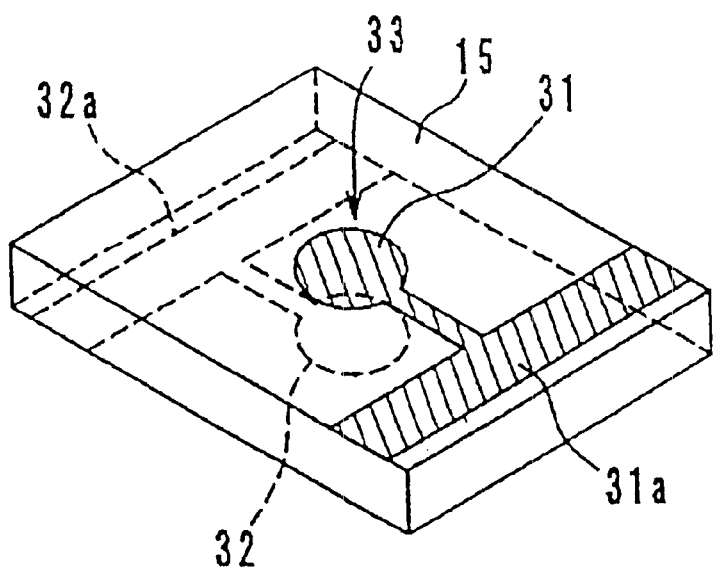
FIG. 2 is a perspective view showing the construction of electrodes of a piezoelectric substrate included in the surface-mount electronic component shown in FIG. 1.

As shown in FIG. 2, vibrating electrodes 31 and 32 are disposed on the corresponding major surfaces of the piezoelectric substrate 15 facing each other. These vibrating electrodes 31 and 32, and the piezoelectric substrate 15 constitute a piezoelectric resonator 33. A lead-in terminal 31a of the vibrating electrode 31 is conducted to the right side of the piezoelectric substrate 15 and, as shown in FIG. 1, is exposed at right portions of the side surfaces 11b (the near side of the main unit 11) and 11c (the far side of the main unit 11). The lead-in terminal 31a is arranged so as not to reach (or is constructed to be spaced away from) the right side of the piezoelectric substrate 15, which means the lead-in terminal 31a is not exposed at a right end surface 11d of the main unit 11. Likewise, a lead-in terminal 32a of the vibrating electrode 32 is conducted to the left side of the piezoelectric substrate 15 and is exposed at left portions of the side surfaces 11b and 11c of the main unit 11. The lead-in terminal 32a is arranged so as not to reach (or is constructed to be spaced away from) the left side of the piezoelectric substrate 15, which means the lead-in terminal 31a is not exposed at a left end surface 11e of the main unit 11.

The terminal electrode films 12 and 14 are electrically connected to the lead-in terminal 31a and 32a, respectively.

In the electronic component 10 having the above-described construction, since portions of the lead-in terminals 31a and 32a are exposed at the side surfaces 11b and 11c and the exposed portions thereof are coated by the terminal electrode films 12 and 14, the easily separable and useless plated film 26 is not formed on each of the exposed portions of the lead-in terminals 31a and 32a. Accordingly, the surface-mount electronic component 10 according to the first preferred embodiment solves the problem of conventional surface-mount electronic components experiencing short-circuiting between terminal electrode films caused by separation of useless films.

Figure 3:
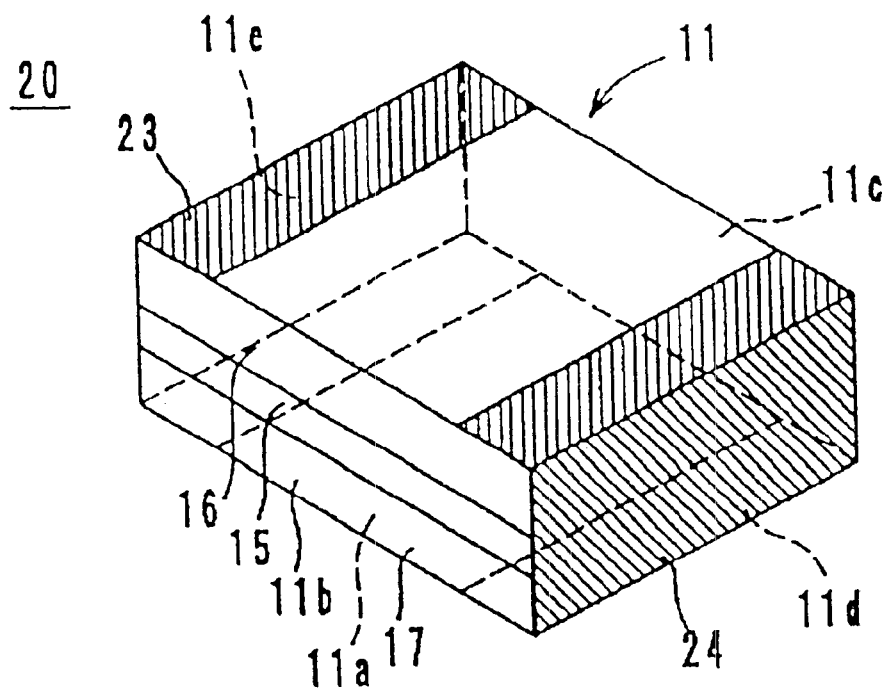
FIG. 3 is a perspective view of a surface-mount electronic component according to a second preferred embodiment of the present invention.

FIG. 3 shows a surface-mount electronic component 20 according to the second preferred embodiment of the present invention. The surface-mount electronic component 20 preferably includes two terminal electrode films 23 and 24 formed on the surface of the main unit 11 by film-forming processing, such as plating or other suitable methods. The terminal electrode film 23 is formed on the surface of the main unit 11, including the left end surface 11e and functions as the input terminal. The terminal electrode film 24 is formed on the surface of the main unit 11, including the right end surface 11d, and functions as the output terminal. In FIG. 3, the bottom surface 11a of the main unit 11 defines a surface mount surface for the surface-mount electronic component 20.

Figure 4:
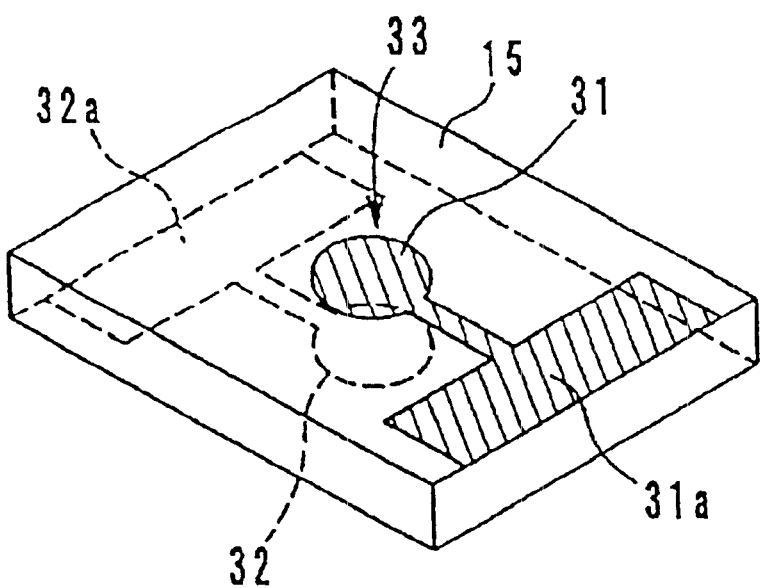
FIG. 4 is a perspective view showing the construction of electrodes of a piezoelectric substrate included in the surface-mount electronic component shown in FIG. 3.

As shown in FIG. 4, the lead-in terminal 31a of the vibrating electrode 31 is conducted up to the right side of the piezoelectric substrate 15 and, as shown in FIG. 3, is exposed at the right end surface 11d of the main unit 11. The lead-in terminal 31a is formed so as not to reach either the near side or the far side of the piezoelectric substrate 15, which means the lead-in terminal 31a is not exposed either at the near side surface 11b or the far side surface 11c of the main unit 11. Likewise, the lead-in terminal 32a of the vibrating electrode 32 is conducted up to the left side of the piezoelectric substrate 15 and is exposed at the left end surface 11e of the main unit 11. The lead-in terminal 32a is formed so as not to reach either the near side or the far side of the piezoelectric substrate 15, which means the lead-in terminal 32a is not exposed either at the near side surface 11b or the far side surface 11c of the main unit 11.

The terminal electrode films 23 and 24 are electrically connected to the lead-in terminal 32a and 31a, respectively.

In the surface-mount electronic component 20 having the above-described construction, since portions of the lead-in terminals 31a and 32a are exposed at the side surfaces 11d and 11e and the exposed parts thereof are coated by the terminal electrode films 24 and 23, the easily separable and useless plated film 26 is not formed on each of the exposed parts of the lead-in terminals 31a and 32a. Accordingly, the surface-mount electronic component 20 according to the second preferred embodiment achieves the same advantages obtained by the surface-mount electronic component 10 according to the first preferred embodiment.

Figure 5:
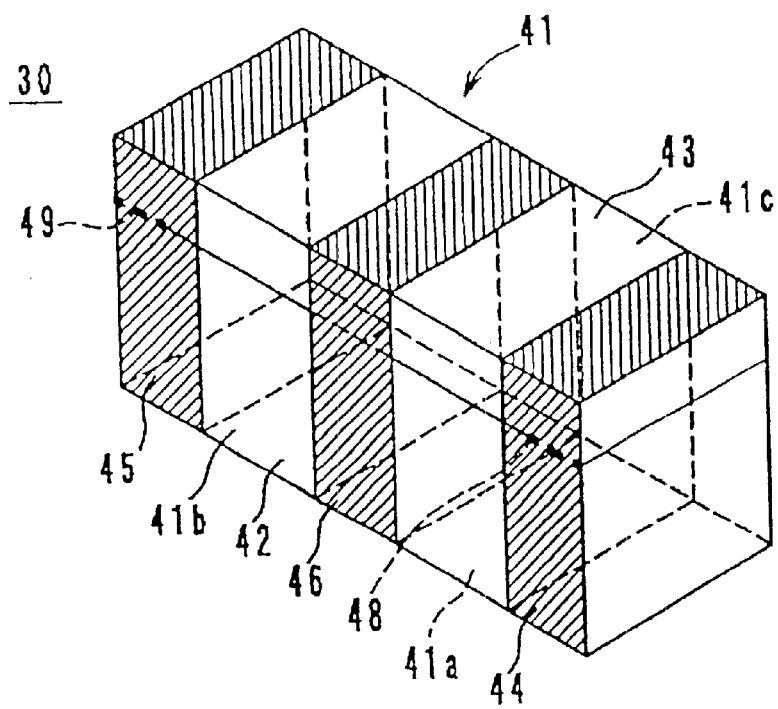
FIG. 5 is a perspective view of a surface-mount electronic component according to a third preferred embodiment of the present invention.

FIG. 5 shows a surface-mount electronic component 30 according to the third preferred embodiment of the present invention. The surface-mount electronic component 30 includes a main unit 41 having a piezoelectric resonator (not shown), which takes advantage of, for example, thickness-slip-vibration, contained in a concave portion of a ceramic casing member 42 and a cover member 43 is adhered to a concave opening of the casing member 42. Terminal electrodes 44 and 45 are formed on the corresponding ends of the main unit 41 by film-forming processing, such as plating or other suitable methods. A terminal electrode film 46 is formed on the approximate central portion of the main unit 41 and functions as the ground terminal. In FIG. 5, the bottom surface 41a of the main unit 41 defines a surface-mount surface for the electronic component 30.

The terminal electrode films 44 and 45 are electrically connected to lead-in terminals 48 and 49 of the corresponding vibrating electrodes of the piezoelectric resonator, respectively. The lead-in terminals 48 and 49 are conducted up to side surfaces 41b and 41c. Exposed parts of the lead-in terminals 48 and 49 on the side surfaces 41b and 41c are coated by the terminal electrode films 44 and 45.

Accordingly, in the same manner as in the surface-mount electronic component 10 according to the first preferred embodiment, the surface-mount electronic component 30 according to the third preferred embodiment solves the problem with the conventional surface-mount electronic components in which short-circuiting between terminal electrode films occurs due to the separation of useless films.

Figure 6:
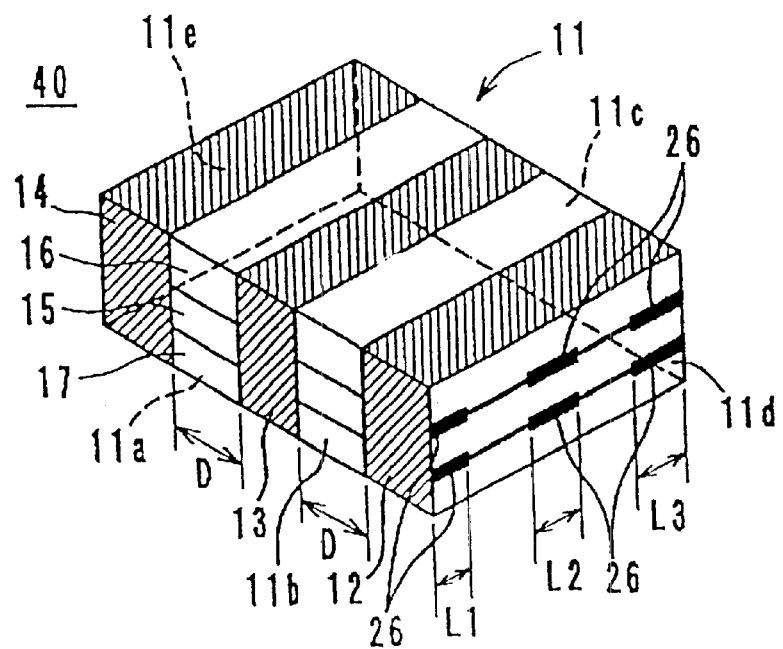
FIG. 6 is a perspective view of a surface-mount electronic component according to a fourth preferred embodiment of the present invention.

In a surface-mount electronic component according to the fourth preferred embodiment, only portions of exposed lead-in terminals are coated by terminal electrode films. As shown in FIG. 6, a surface-mount electronic component 40 has the three-terminal electrode films 12 to 14 formed on the surface of the main unit 11 by film-forming processing, such as plating or other suitable processes.

The terminal electrode films 12 and 14 are formed so as to extend around the corresponding end portions of the main unit 11 and function as the input terminal and the output terminal, respectively. The terminal electrode film 13 is formed between the terminal electrodes 12 and 14 so as to extend around the approximately central portion of the main unit 11 and functions as the ground terminal. The bottom surface 11a of the main unit 11 defines a surface-mount surface of the surface-mount electronic component 40.

Figure 7:
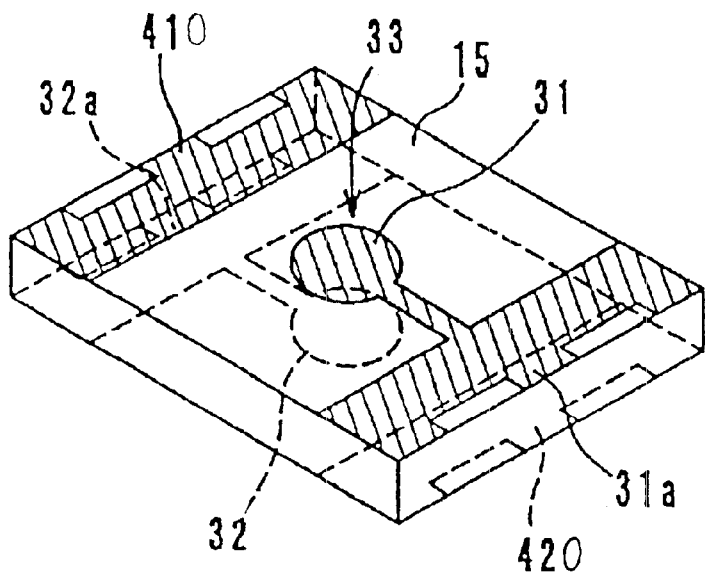
FIG. 7 is a perspective view showing the construction of electrodes of a piezoelectric substrate included in the surface-mount electronic component shown in FIG. 6.

As shown in FIG. 7, the vibrating electrodes 31 and 32 are formed on the corresponding major surfaces of the piezoelectric substrate 15 facing each other. These vibrating electrodes 31 and 32, and the piezoelectric substrate 15 constitute the piezoelectric resonator 33. In addition, dummy electrode films 410 and 420 are formed on the corresponding major surfaces of the piezoelectric substrate 15. The lead-in terminal 31a of the vibrating electrode 31 and the dummy electrode film 420 are conducted to the right side of the piezoelectric substrate 15 and, as shown in FIG. 6, are exposed at right portions of the side surfaces 11b (the near side of the main unit 11) and 11c (the far side of the main unit 11), and the right end surface 11d. Portions of the lead-in terminal 31a and portions of the dummy electrode film 420 are formed so as not to reach (are formed to be spaced away from) the right side of the piezoelectric substrate 15. Likewise, the lead-in terminal 32a of the vibrating electrode 32 and the dummy electrode film 410 are conducted to the left side of the piezoelectric substrate 15 and are exposed at left portions of the side surfaces 11b and 11c, and the left end surface 11e. Portions of the lead-in terminal 32a and portions of the dummy electrode film 410 are formed so as not to reach (are formed to be spaced away from) the left side of the piezoelectric substrate 15.

In the surface-mount electronic component 40 having the above-described construction, the lead-in terminals 31a and 32a and the dummy electrode films 410 and 420 are exposed at the side surfaces 11b and 11c, and the exposed portions thereof are coated by the terminal electrode films 12 and 14. The lead-in terminals 31a and 32a and the dummy electrode films 420 and 410 are exposed at the corresponding end surfaces 11d and 11e, and the exposed portions thereof are not coated by either of the terminal electrode films 12 and 14.

As shown in FIG. 6, the distances between the terminal electrode films 12 and 13, and between the terminal electrode films 13 and 14 are substantially equal to D. The lengths of the exposed-but-uncoated portions of the terminal electrode films 12 and 14 and those of the dummy electrode films 410 and 420 are substantially equal to L1, L2, and L3. The portions of the lead-in terminals 31a and 32a and the dummy electrode films 410 and 420 are arranged to be spaced away from the right side of the piezoelectric substrate 15 so that the conditional expressions $L1<D$, $L2<D$, and $L3<D$ are satisfied.

With the above-described construction, when the terminal electrode films 12 to 14 are formed, the length of the useless plated film 26, which is formed on each of the exposed portions of the lead-in terminals 31a and 32a and of the exposed portions of the dummy electrode films 410 and 420, is shorter than the distance D. Accordingly, even though the useless plated film 26 may separate from the exposed part of the lead-in terminal 31a or 32a, this separated plated film 26 cannot cause short-circuiting between the terminal electrode films 12 and 13 or between the terminal electrode films 13 and 14.

In the fourth preferred embodiment, each of the lead-in terminals 31a and 32a and the dummy electrode films 410 and 420 has the three exposed portions on each of the side surfaces 11d and 11e of the main unit 11. However, the number of the exposed parts is not necessarily three. The number of the exposed parts may be 1, 2, or more than 3 as long as the length of each of the exposed portions of the lead-in terminals 12 and 14 and the dummy electrode films 410 and 420 is shorter than the distance D.

Figure 8:
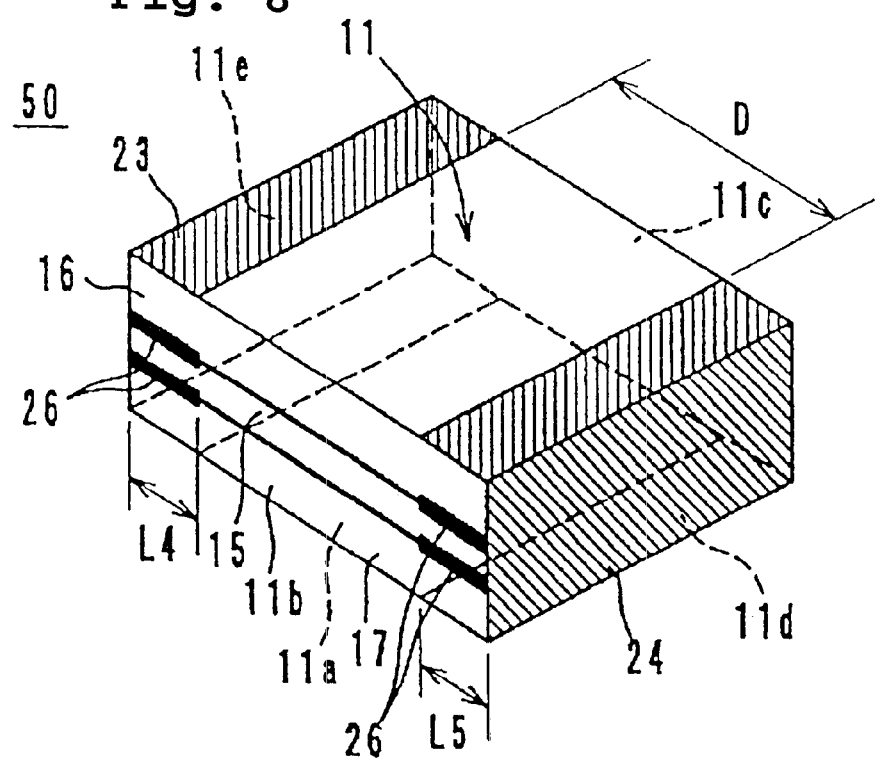
FIG. 8 is a perspective view of a surface-mount electronic component according to a fifth preferred embodiment of the present invention.

As shown in FIG. 8, a surface-mount electronic component 50 according to the fifth preferred embodiment has the two terminal films 23 and 24 formed on the surface of the main unit 11 by film-forming processing, such as plating or other suitable processes.

Figure 9:
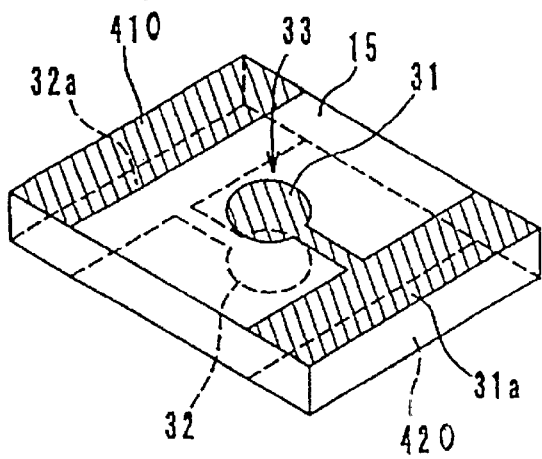
FIG. 9 is a perspective view showing the construction of electrodes of a piezoelectric substrate included in the surface-mount electronic component shown in FIG. 8.

As shown in FIG. 9, the lead-in terminal 31a of the vibrating electrode 31 and the dummy electrode film 420 are conducted up to the right side of the piezoelectric substrate 15, and as shown in FIG. 8, are exposed at the right end surface 11d as well as the near side surface 11b and the far side surface 11c. Likewise, the lead-in terminal 32a of the vibrating electrode 32 and the dummy electrode film 410 are conducted up to the left side of the piezoelectric substrate 15 and are exposed at the left end surface 11e as well as the near side surface 11b and the far side surface 11c.

In the surface-mount electronic component 50 having the above-described construction, portions of the lead-in terminals 31a and 32a and those of the dummy electrode films 420 and 410 are exposed at the corresponding end surfaces 11e and 11d, and these exposed portions are coated by the corresponding terminal electrode films 23 and 24.

On the other hand, the portions of the lead-in terminals 31a and 32a and those of the dummy electrode films 420 and 410 are exposed at the near side surface 11b and the far side surface 11c and are not coated by either of the terminal electrode films 23 and 24. The surface-mount electronic component 50 is constructed such that, as shown in FIG. 8, the distance between the terminal electrode films 23 and 24 is preferably substantially equal to D and the lengths of the exposed-but-uncoated portions of the lead-in terminals 31a and 32a and those of the dummy electrode films 410 and 420 are substantially equal to L4 and L5 so that the conditional expressions L4<D and L5<D are satisfied.

With the above-described construction, when the terminal electrode films 23 and 24 are formed, the length of the useless plated film 26 on each of the exposed-but-uncoated portions of the lead-in terminals 31a and 32a and the exposed-but-uncoated portions of the dummy electrode films 410 and 420 is formed to be shorter than the distance D. Accordingly, even though the useless plated film 26 may separate from the exposed portion of the lead-in terminal 31a or 32a, this separated plated film 26 cannot cause short-circuiting between the terminal electrode films 23 and 24.

Figure 10:
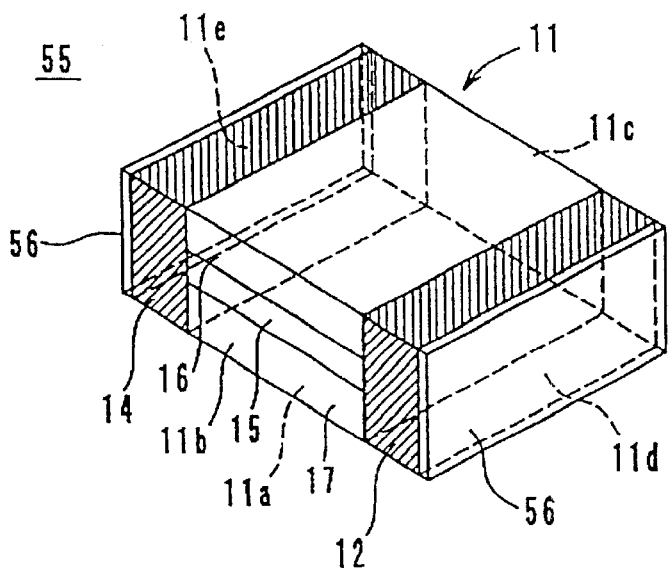
FIG. 10 is a perspective view of a surface-mount electronic component according to a sixth preferred embodiment of the present invention.

As shown in FIG. 10, a surface-mount electronic component 55 has exposed portions of internal electrodes coated by a protective film 56 and the terminal electrode films 12 and 14. The piezoelectric substrate 15 has the vibrating electrodes 31 and 32 and the dummy electrodes 410 and 420 formed thereon in the same manner as shown in the piezoelectric substrate 15 according to the fifth preferred embodiment in FIG. 9.

The protective film 56, made of resin, is formed on each of the entire end surfaces 11d and 11e of the main unit 11 before the terminal electrode films 12 and 14 are formed. The terminal electrode films 12 and 14 and the protective film 56 cover the entire exposed parts of the lead-in terminals 31a and 32a and the dummy electrode films 410 and 420 which are conducted up to the side surfaces 11b and 11c and the corresponding end surfaces 11d and 11e.

With this construction, since the portions of the leading terminals 31a and 32a and the dummy electrode films 410 and 420 which are exposed at the side surfaces 11b and 11c and the corresponding end surfaces 11d and 11e are coated by the terminal electrode films 12 and 14 and the protective film 56, when the terminal electrode films 12 and 14 are formed by plating, there is no risk in that easily separable and useless plated films 26 are formed on the surfaces of the lead-in terminals 31a and 32a and the dummy electrode films 410 and 420. Thus, the surface-mount electronic component 55 solves the problem with the conventional surface-mount electronic components in which short-circuit between terminal electrode films occurs due to the separation of useless films.

Figure 14:
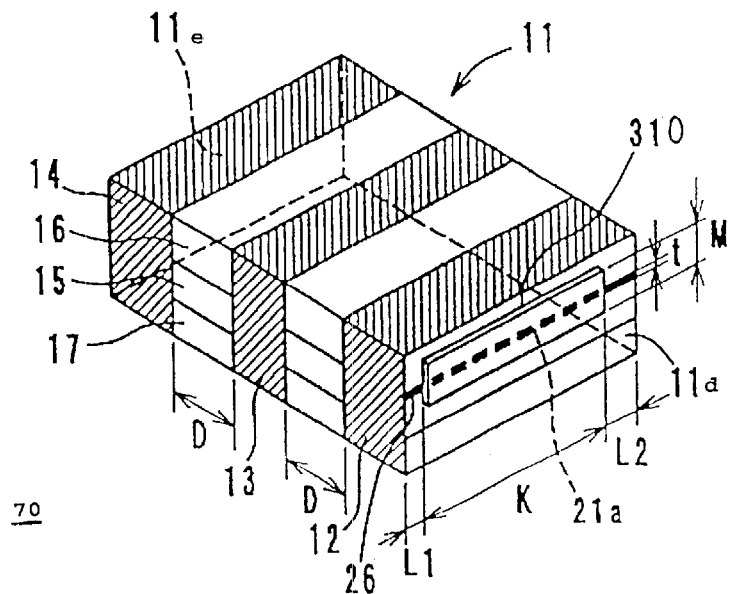
FIG. 14 is a perspective view of a surface-mount electronic component according to a seventh preferred embodiment of the present invention.

FIG. 14 shows a surface-mount electronic component 70 according to the seventh preferred embodiment of the present invention. The surface-mount electronic component 70 includes the three-terminal electrode films 12 to 14 formed on the surface of the main unit 11 by electroless plating, electroplating, or other suitable processes. The terminal electrode films 12 and 14 are formed on the corresponding ends of the main unit 11 and function as the input terminal and the output terminal, respectively. The terminal electrode film 13 is formed between the terminal electrode films 12 and 14 and functions as the ground terminal.

The protective films 310, made of resin, are formed on the corresponding end surfaces 11d and 11e of the main unit 11 before the terminal electrode films 12 to 14 are formed. As shown in FIG. 14, these protective films 310 partially cover exposed portions of the lead-in terminals 21a and 22a of the vibrating electrodes 21 and 22 which are conducted up to the end surfaces 11d and 11e of the main unit 11, respectively.

With this construction, portions of the lead-in terminals 21a and 22a are exposed at the side surfaces 11d and 11e and these exposed portions are partially coated by the protective films 310 and 310. Accordingly, when terminal electrode films 12 to 14 are formed by plating, there is no risk that easily separable and useless plated films will be formed on the surfaces of the lead-in terminals 21a and 22a. Thus, the surface-mount electronic component 70 solves the problem of the conventional surface-mount electronic components in which short-circuiting between terminal electrode films occurs due to the separation of useless films.

The length and the width of the protective film 310 are defined as follows. When the distance between the terminal electrode films 12 and 13 and the distance between the terminal electrode films 13 and 14 are substantially equal to D, and the lengths of the exposed-but-uncoated parts of the lead-in terminals 21a and 22a are substantially equal to L1 and L2, the length K of the protective film 310 is arranged so that the conditional expressions L1<D and L2<D are satisfied. In addition, the width M of the protective film 310 is preferably greater than the thickness t of each of the exposed-but-uncoated parts of the lead-in terminals 21a and 22a.

With the above-described setting of the length K and width M of each of the protective films 310, when the terminal electrode films 12 to 14 are formed, the length of the useless plated film 26 formed on each of the exposed-but-uncoated parts of the lead-in terminals 21a and 22a is shorter than the distance D. Accordingly, even though the useless plated film 26 is separated from the exposed-but-uncoated part of the lead-in terminal 21a or 22a, this separated plated film 26 cannot cause short-circuiting between the terminal electrode films 12 and 13 or between the terminal electrode films 13 and 14.

The present invention is not limited to the above-described preferred embodiments, and various changes and modifications may be made to the present invention without departing from the spirit and the scope thereof.

Figure 15:
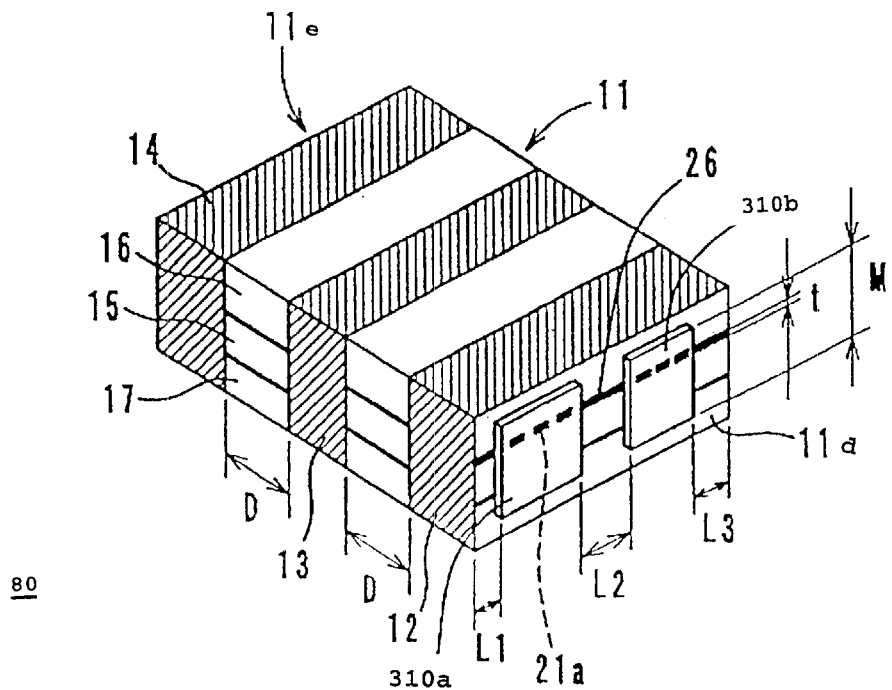
FIG. 15 is a perspective view of a surface-mount electronic component according to another preferred embodiment of the present invention.

In a surface-mount electronic component 80, the protective film 310 according to the seventh preferred embodiment in FIG. 14 may be divided so as to form a plurality of protective films, such as 310a and 310b shown in FIG. 15. At this time, the lengths of the exposed parts of the lead-in terminal 21a, which are not coated by either of the protective films 310a and 310b, are arranged such that the conditional expressions L1<D, L2<D, and L3<D are satisfied. The present invention may not only be included in the piezoelectric member, but may also be included in an inductor, a capacitor, or other suitable electronic component.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface-mount electronic component comprising:
   a main unit including an internal electrode disposed therein;
   a terminal electrode film which is a thin film-processed film and is disposed on a surface of the main unit of said surface-mount electronic component; and
   a lead-in terminal extending from the internal electrode disposed in said surface-mount electronic component and to the surface of the main unit so as to establish electrical connection between said internal electrode and said terminal electrode film; wherein
   portions of said lead-in terminal of said internal electrode extend to and are exposed at two side-edge surfaces of the main unit, and are not exposed at a surface-mount surface of the main unit and the opposite surface of the surface-mount surface; and
   exposed portions of said lead-in terminal are coated by at least one of said terminal electrode film and a protective film.

2. A surface-mount electronic component according to claim 1, wherein said surface-mount electronic component has at least two terminal electrode films and at least two lead-in terminals including exposed portions thereof, the length of the exposed portion of each of said at least two lead-in terminals which is coated by at least one of said at least two terminal electrode films and said protective film, is less than the distance between said at least two terminal electrode films.

3. A surface-mount electronic component according to claim 1, wherein said lead-in terminal does not extend to end surfaces of said main unit.

4. A surface-mount electronic component according to claim 1, wherein said lead-in terminal further includes portions that extend to end surfaces of said main unit.

5. A surface-mount electronic component according to claim 1, further comprising a piezoelectric substrate, wherein said internal electrode is disposed on said piezoelectric substrate.

6. A surface-mount electronic component according to claim 5, further including at least one dummy electrode film mounted on said piezoelectric substrate.

7. A surface-mount electronic component according to claim 1, wherein one portion of said exposed portion is coated with said protective film, and another portion of said exposed portion is coated with said terminal electrode film.

8. A surface-mount electronic component comprising:
   a main unit including an internal electrode disposed therein;
   a terminal electrode film which is a thin film-processed film and is disposed on at least one surface of the main unit of said surface-mount electronic component; and
   at least one lead-in terminal extending from the internal electrode disposed in said surface-mount electronic component to at least an end surface of the main unit so as to establish electrical connection between said internal electrode and said terminal electrode film; wherein
   said at least one lead-in terminal of said internal electrode does not extend to a surface-mount surface of the main unit or the surface opposite to the surface-mount surface; and
   said at least one lead-in terminal includes at least one exposed portion at said end portion which is coated by at least one of said terminal electrode film and a protective film.

9. A surface-mount electronic component according to claim 8, wherein said at least one exposed portion of said lead-in terminal includes a plurality of exposed portions disposed at said end surface of said main unit.

10. A surface-mount electronic component according to claim 9, wherein said surface-mount electronic component has at least two terminal electrode films spaced a distance D from each other, the length of each of said plurality of exposed portions is less than said distance D.

11. A surface-mount electronic component according to claim 8, wherein said at least one exposed portion of said lead-in terminal further includes a plurality of exposed portions disposed at side-edge surfaces of said main unit.

12. A surface-mount electronic component according to claim 11, wherein said surface-mount electronic component has at least two terminal electrode films spaced a distance D from each other, the length of each of said plurality of exposed portions is less than said distance D.

13. A surface-mount electronic component according to claim 8, wherein each of said at least one exposed portion includes a portion coated with said protective coating and a portion coated with said terminal electrode film.

14. A surface-mount electronic component according to claim 8, wherein said surface-mount electronic component has at least two terminal electrode films spaced a distance D from each other, the length of said portion coated with said terminal electrode film is less than the distance D.

* * * * *